(12) United States Patent
Pedersen

(10) Patent No.: US 7,042,247 B1
(45) Date of Patent: May 9, 2006

(54) PROGRAMMABLE LOOK-UP TABLES WITH REDUCED LEAKAGE CURRENT

(75) Inventor: Bruce Pedersen, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 69 days.

(21) Appl. No.: 10/918,603

(22) Filed: Aug. 12, 2004

(51) Int. Cl.
*H03K 19/173* (2006.01)

(52) U.S. Cl. .......................... 326/38; 326/41
(58) Field of Classification Search ............ 326/38–41, 326/46, 104
See application file for complete search history.

(56) References Cited

U.S. PATENT DOCUMENTS

| | | | |
|---|---|---|---|
| 5,260,611 A | 11/1993 | Cliff et al. | |
| 5,274,581 A | 12/1993 | Cliff et al. | |
| 5,481,486 A | 1/1996 | Cliff et al. | |
| 5,953,537 A * | 9/1999 | Balicki et al. | 712/1 |
| 6,037,829 A * | 3/2000 | Reddy et al. | 327/408 |
| 6,215,326 B1 | 4/2001 | Jefferson et al. | |
| 2005/0146352 A1* | 7/2005 | Madurawe | 326/41 |
| 2005/0174144 A1* | 8/2005 | Veredas-Ramirez et al. | 326/38 |

* cited by examiner

*Primary Examiner*—Don Le
(74) *Attorney, Agent, or Firm*—Fish & Neave IP Group Ropes & Gray LLP; Robert R. Jackson

(57) ABSTRACT

The number of off and possibly leaking transistors in circuitry such as look-up table (LUT) circuitry is reduced by dividing the LUT or LUT-type circuitry into two separate or at least partly separate circuits. One of these circuits operates on first manifestations of the signals selectable by the circuitry. The other circuit operates on electrically different second manifestations of the selectable signals. Selections made by the two circuits are combined to produce an output of the circuitry.

25 Claims, 8 Drawing Sheets

| EMBODIMENT | FIRST LOGICAL OF SELECTABLE SIGNAL | | SECOND LOGICAL OF SELECTABLE SIGNAL | |
|---|---|---|---|---|
| | FIRST MANIFESTATION | SECOND MANIFESTATION | FIRST MANIFESTATION | SECOND MANIFESTATION |
| 110 | 1 | NO DRIVE | NO DRIVE | 0 |
| 210 | 1 | NO DRIVE | NO DRIVE | 0 |
| 310 | 1' | NO DRIVE | NO DRIVE | 0 |
| 410 | 1 | NO DRIVE | NO DRIVE | 0 |
| 510 | 1 | NO DRIVE | NO DRIVE | 0 |

PROGRAMMABLE LOOK-UP TABLES WITH REDUCED LEAKAGE CURRENT

BACKGROUND OF THE INVENTION

This invention relates to programmable look-up tables (LUTs) that have less leakage current than those in the prior art.

The logic cells that comprise a programmable logic device (PLD) often use programmable look-up tables (LUTs) as a means of implementing logic functions. (See, for example, Jefferson et al. U.S. Pat. No. 6,215,326.) These LUTs typically have N inputs that control a $2^N$-input multiplexer (mux), with $2^N$ programmable static RAM bits, each feeding one of the $2^N$ inputs of the mux. This allows the LUT to implement any combinational logic function of the N inputs. Typically, to avoid RAM-disturb issues, the output of each RAM feeding the LUT will be buffered with an inverter before feeding the input to the LUT. The $2^N$-input mux is typically created out of either an NMOS or full CMOS tree (e.g., FIGS. 1 and 2 herein, respectively). The CMOS tree (e.g., FIG. 2) has the advantage that the output of the LUT experiences a full voltage swing, while the NMOS mux (e.g., FIG. 1) has a Vt threshold voltage drop when the output is high, and thus may require a level-restorer on its output.

As CMOS processes have scaled down, transistors that would normally be "off" have begun to leak current. Whenever an off-transistor has its source and drain tied to different voltages, there is the potential for leakage current. In the examples shown FIGS. 1 and 2, the "off" transistors that may leak current have arrows pointing toward them. In devices with millions of transistors, this leakage current can add up to a large amount of stand-by power consumption. The invention described herein reduces the number of leaking transistors in the LUT, thus reducing the DC power consumption of the programmable device.

SUMMARY OF THE INVENTION

In order to reduce transistor leakage current in circuitry (e.g., LUT circuitry) for selecting a desired signal from a plurality of selectable signals in accordance with this invention, each of the selectable signals is provided in two, electrically different, signal manifestations. Each of the two electrically different manifestations of a selectable signal is itself different, depending on the logical state (0 or 1) of the selectable signal. For example, if a selectable signal has a first logical state (e.g., 0), the first manifestation of that signal may be logic 1 and the second manifestation may be "no drive." ("No drive" means that a node receiving that signal manifestation is not driven to any particular voltage level by that signal manifestation.) If a selectable signal has a second logical state (e.g., 1), the first manifestation may be no drive and the second manifestation may be logic 0. The first and second manifestations of the selectable signals are respectively operated on by at least partly separate selection circuits, both of which are responsive to one or more selection control signals to select the desired signal. The selections made by the at least partly separate selection circuits are combined to produce an output of the desired signal.

As a result of the foregoing circuit configuration, more of the transistors in the circuitry that are off are in series with other off transistors, as compared to prior circuitry that does not use the invention. This substantially reduces transistor leakage current in the circuitry of this invention as compared to the prior circuitry.

The invention can be implemented in apparatus or method forms.

Further features of the invention, its nature and various advantages, will be more apparent from the accompanying drawings and the following detailed description.

BRIEF DESCRIPTION OF THE DRAWINGS

FIG. 8 is a table summarizing illustrative signal conditions at certain locations in the circuitry shown in FIGS. 3–7 in accordance with the invention.

DETAILED DESCRIPTION

Figure 1:
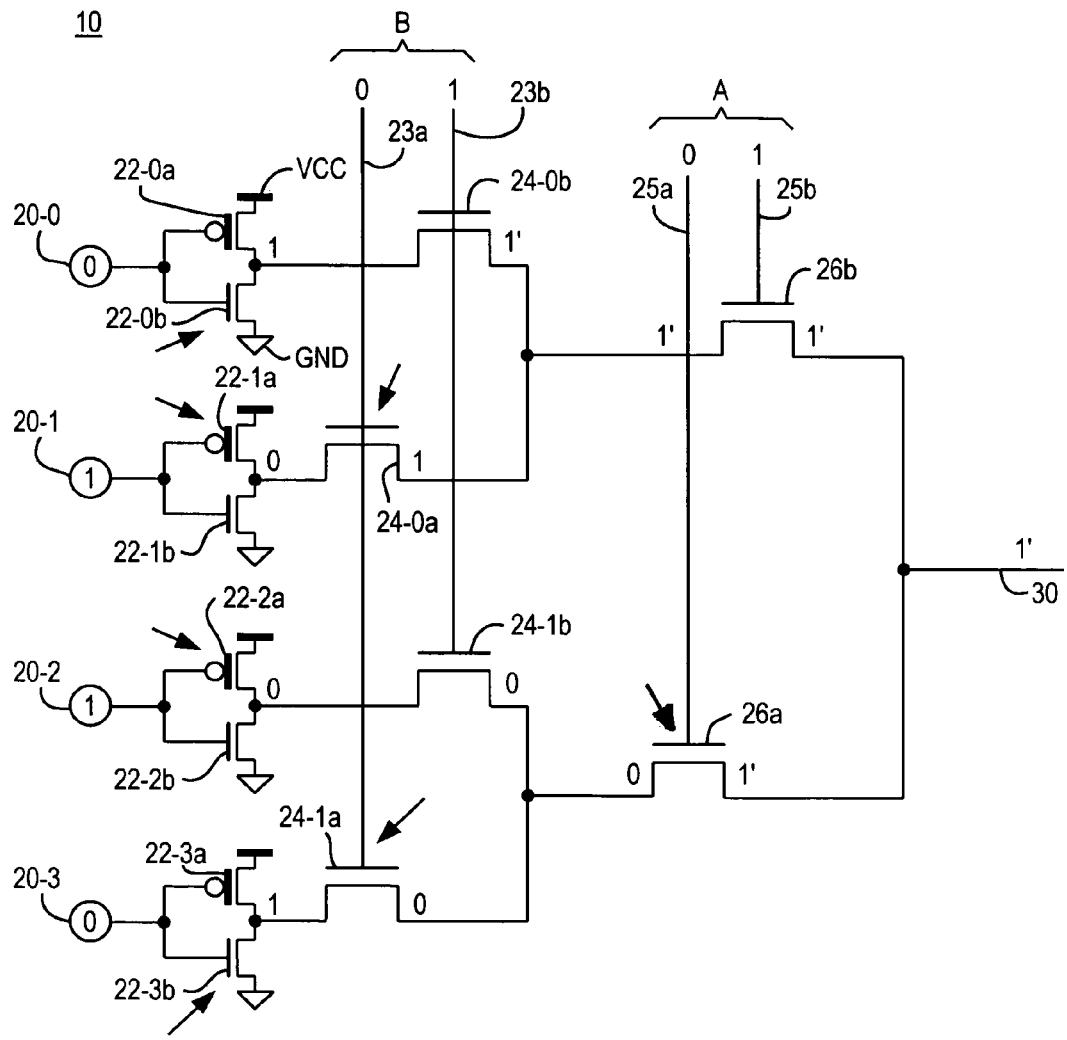
FIG. 1 is a simplified schematic diagram of illustrative, known, LUT circuitry.

FIG. 1 shows a well known LUT configuration 10 that is mentioned in the background section of this specification and that can be further described here briefly (because it is so well known). LUT 10 is a two-input LUT, but it will be understood that this is only illustrative and that LUTs can have any other number of inputs (e.g., one input, or more than two inputs). The two inputs to LUT 10 are A and B. The values shown for A and B in FIG. 1 are only illustrative, and these values can be different under different operating conditions of LUT 10. For example, input B is shown having the value that applies logic 0 to lead 23a and logic 1 to lead 23b, but these values could be reversed (i.e., logic 1 applied to lead 23a and logic 0 applied to lead 23b).

As a two-input LUT, LUT 10 has four programmable RAM bits 20-0 through 20-3. RAM bits 20 are shown programmed with particular values (e.g., 20-0 is programmed logic 0; 20-1 is programmed logic 1; etc.). Again, these values are only illustrative, and any desired values can be programmed into RAM bits 20.

The output of each RAM bit 20 is applied to a respective one of buffers 22. Each buffer 22 includes a PMOS transistor connected in series with an NMOS transistor between VCC (logic 1) and GND (logic 0). For example, buffer 22-0 includes PMOS transistor 22-0a connected in series with NMOS transistor 22-0b between VCC and GND. Each buffer 22 inverts the output of the associated RAM bit 20.

The outputs of buffers 22 are the selectable inputs to the mux portion of LUT 10. Inputs A and B are the selection control inputs to that mux circuitry. The first stage of the mux selection is performed by NMOS transistors 24, controlled by signals derived from selection control input B. For example, input B may be applied to lead 23a and thus to the gates of NMOS transistors 24-0a and 24-1a. The complement of input B may be applied to lead 23b and thus to the gates of NMOS transistors 24-0b and 24-1b. The second stage of the mux selection is performed by NMOS transistors 26, controlled by signals derived from selection control input A. For example, input A may be applied to lead 25a and thus to the gate of NMOS transistor 26a. The complement of input A may be applied to lead 25b and thus to the gate of NMOS transistor 26b.

Given the particular values programmed into RAM bits 20 and the particular values shown for inputs A and B, the following transistors in LUT 10 will be on: 22-0a, 22-1b, 22-2b, 22-3a, 24-0b, 24-1b, and 26b. The following transistors will nominally be off but potentially leaking: 22-0b, 22-1a, 22-2a, 22-3b, 24-0a, 24-1a, and 26a. The nominally off but possibly leaking transistors are indicated by the arrows pointing toward them in FIG. 1. The particular values of A and B shown in FIG. 1 cause LUT 10 to output (on lead 30) the contents of RAM bit 20-0 as inverted by inverter 22-0. The value of the signal on lead 30 in this particular example is shown as 1' because the voltage of this signal is VCC minus the voltage drop across series-connected NMOS transistors 24-0b and 26b. (The voltage drop across an NMOS transistor is Vt.)

Figure 2:
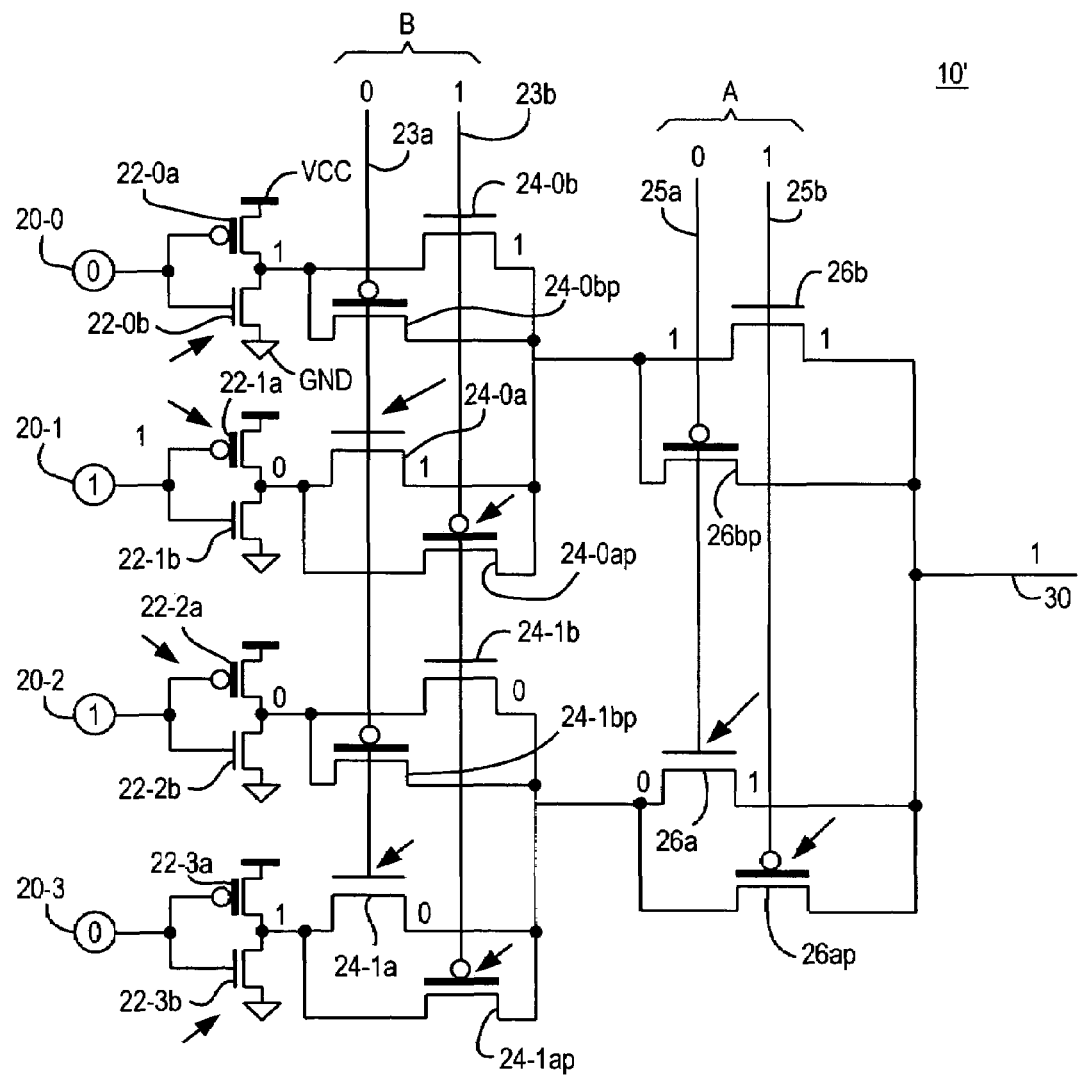
FIG. 2 is a simplified schematic diagram of other illustrative, known, LUT circuitry.

FIG. 2 is similar to FIG. 1, but illustrates the use of full CMOS circuitry in the mux portion of LUT 10'. For example, in FIG. 2, NMOS transistor 24-0b is augmented by PMOS transistor 24-0bp, which is connected in parallel with the NMOS transistor. Assuming again that the complement of B is applied to the gate of transistor 24-0b via lead 23b, B is applied to the gate of transistor 24-0bp via lead 23a. Use of full CMOS mux circuitry as in FIG. 2 avoids loss of logic 1 voltage. Thus the output signal on lead 30 in FIG. 2 is logic 1, rather than 1' as in FIG. 1 and described above. Given the particular data (20) and control (A and B) signal values employed in the example shown in FIG. 2, the following transistors will be on: 22-0a, 22-1b, 22-2b, 22-3a, 24-0b, 24-0bp, 24-1b, 24-1bp, 26b, and 26bp. The following transistors will be nominally off but possibly leaking: 22-0b, 22-1a, 22-2a, 22-3b, 24-0a, 24-0ap, 24-1a, 24-1ap, 26a, and 26ap.

In accordance with certain embodiments of the invention (see, e.g., FIG. 3), a CMOS LUT tree 110 is split into two independent trees joined only at their outputs 130. The first tree includes only NMOS gates 124-0a, 124-0b, 124-1a, 124-1b, 126a, and 126b, while the second tree includes only PMOS gates 124-0ap, 124-0bp, 124-1ap, 124-1bp, 126ap, and 126bp. The CMOS inverter 122, which is typically used to buffer the output of the RAMs 120, is also split: with the drain of the NMOS device (e.g., 122-0b) tied to an input of the NMOS tree, and the drain of the PMOS device (e.g., 122-0a) tied to the input of the PMOS tree. Thus, the sources of all the NMOS devices (e.g., 124-0a) in the NMOS tree (including the NMOS gate (e.g., 122-0b) fed by the RAM (e.g., 120-0)) are either tied to GND or the drains of other NMOS devices (except for the output 130 of the NMOS tree), and the sources of all the PMOS devices (e.g., 124-0bp) in the PMOS tree (including the PMOS gate (e.g., 122-0a) fed by the RAM (e.g., 120-0a)) are either tied to VCC or the drains of other PMOS devices (except for the output 130 of the PMOS tree). Because of this, any leakage current from GND to VCC through the N-level LUT needs to follow a path all the way through N NMOS devices to the output 130 of the LUT, and then back down through N PMOS devices. It is well known in the art that the leakage current through two (or more) off transistors in series is much less than the leakage current through a single off transistor.

In a CMOS N-input LUT constructed in accordance with this invention, there will be at most (N+1) off transistors that are not in series with some other off transistor. These transistors are shown with arrows pointing toward them in FIG. 3 (for a particular, illustrative set of data (120) and control (A and B) signal values). In a normal CMOS LUT 10', as shown in FIG. 2, there can be up to $3*2^N-2$ off transistors that are not in series with some other off transistor, while having different voltages on their sources and drains. Thus, for a large LUT, the number of transistors that have significant leakage is exponentially less for a LUT constructed in accordance with this invention. This LUT, like the conventional CMOS LUT 10', has the advantage that the output 130 of the LUT experiences a full voltage swing, and thus does not require a level restorer on the output.

Figure 3:
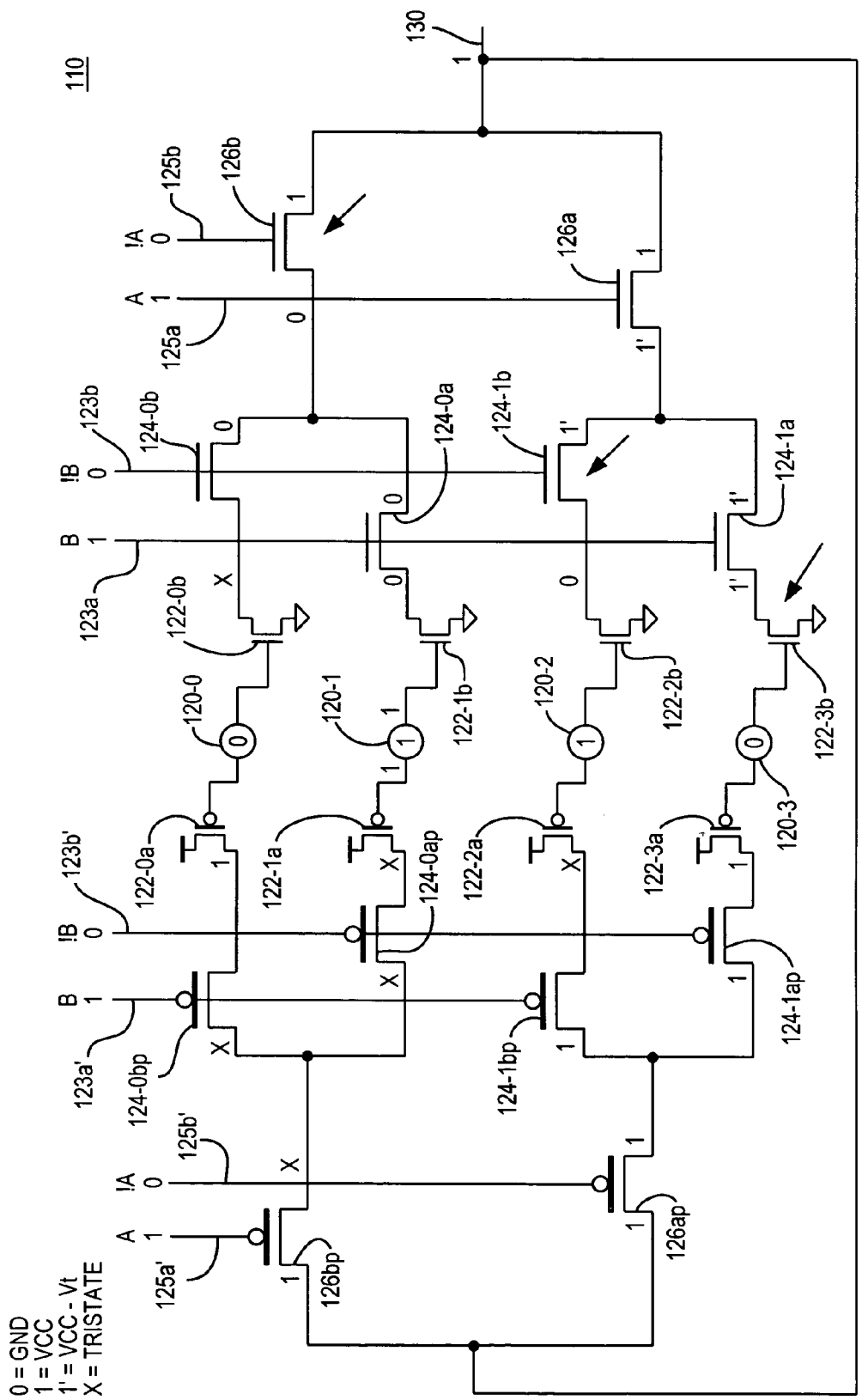
FIG. 3 is a simplified schematic diagram of an illustrative embodiment of the invention.

In FIG. 3 (and subsequent FIGS.) some nodes are described as being "tristate" (indicated by an X on the node in the drawing). This means that the node is floating, i.e., that there is no path from that node through transistors that are on to either VCC or GND. There may be some small leakage current through these nodes via the off transistors, but typically they will float to a voltage somewhere between VCC and GND (e.g., approximately 0.5V). Of course, the particular nodes that are tristate in FIG. 3 will depend on the particular data (120) and control (A and B) signal values that the circuit sees. Different data and control signal values will cause different nodes to be tristate, just as different data and control signal values cause different nodes to be 0, 1, and 1'.

Figure 4:
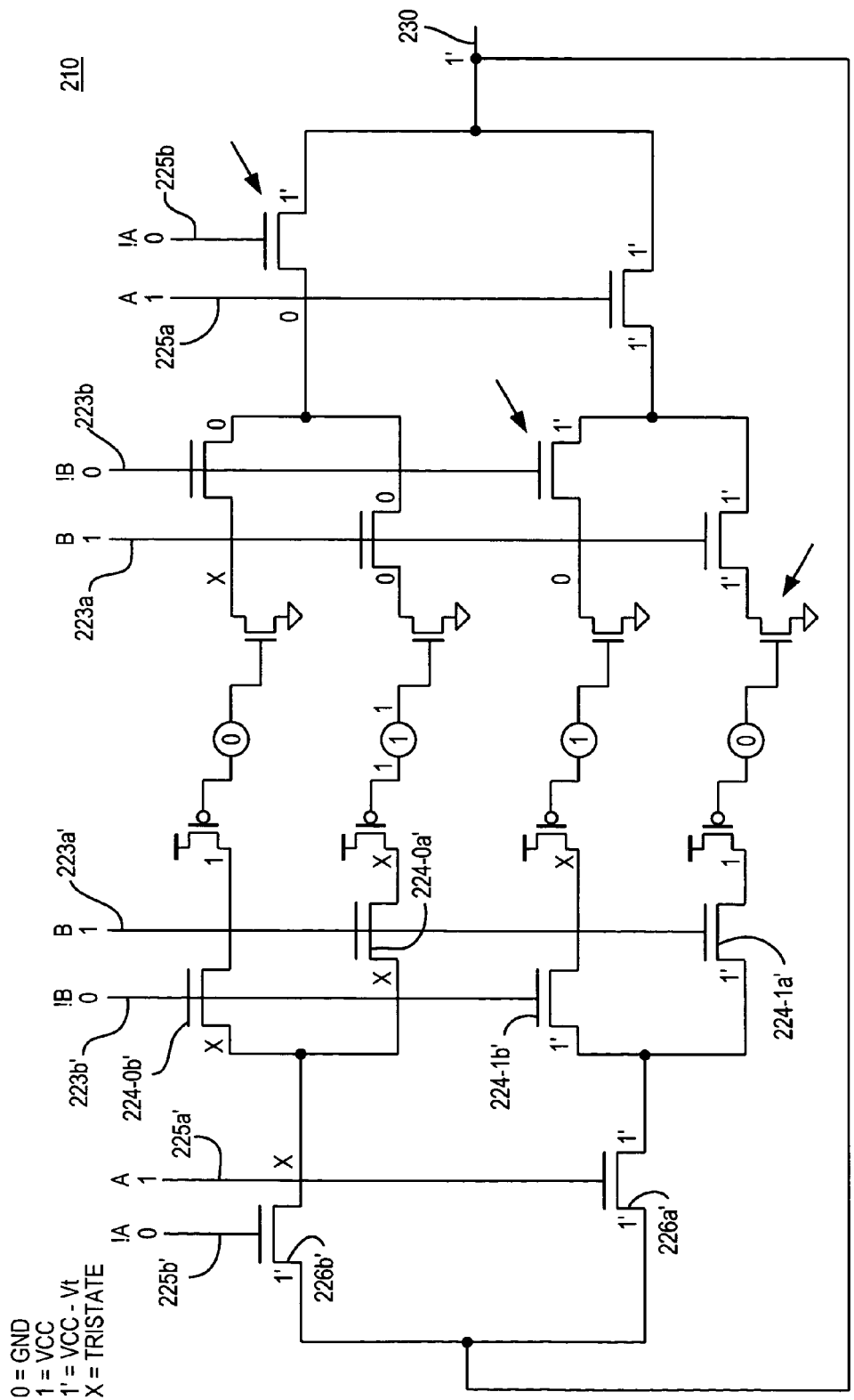
FIG. 4 is a simplified schematic diagram of another illustrative embodiment of the invention.

FIG. 4 shows an alternative embodiment 210 of the invention in which the PMOS tree of FIG. 3 is replaced by an NMOS tree 224-0a', 224-0b', 224-1a', 224-1b', 226a', and 226b'. In this case, a level-restoring circuit may be required on the output 230 of the LUT 210, because replacing a PMOS tree with an NMOS tree no longer allows the output to experience a full voltage swing. If NMOS devices have significantly better drive characteristics than PMOS devices, using NMOS devices in both trees may nevertheless result in a faster LUT. Again, transistors that are off and not in series with another off transistor are indicated by the arrows in FIG. 4 (for a particular, illustrative set of data and control signal values).

Figure 5:
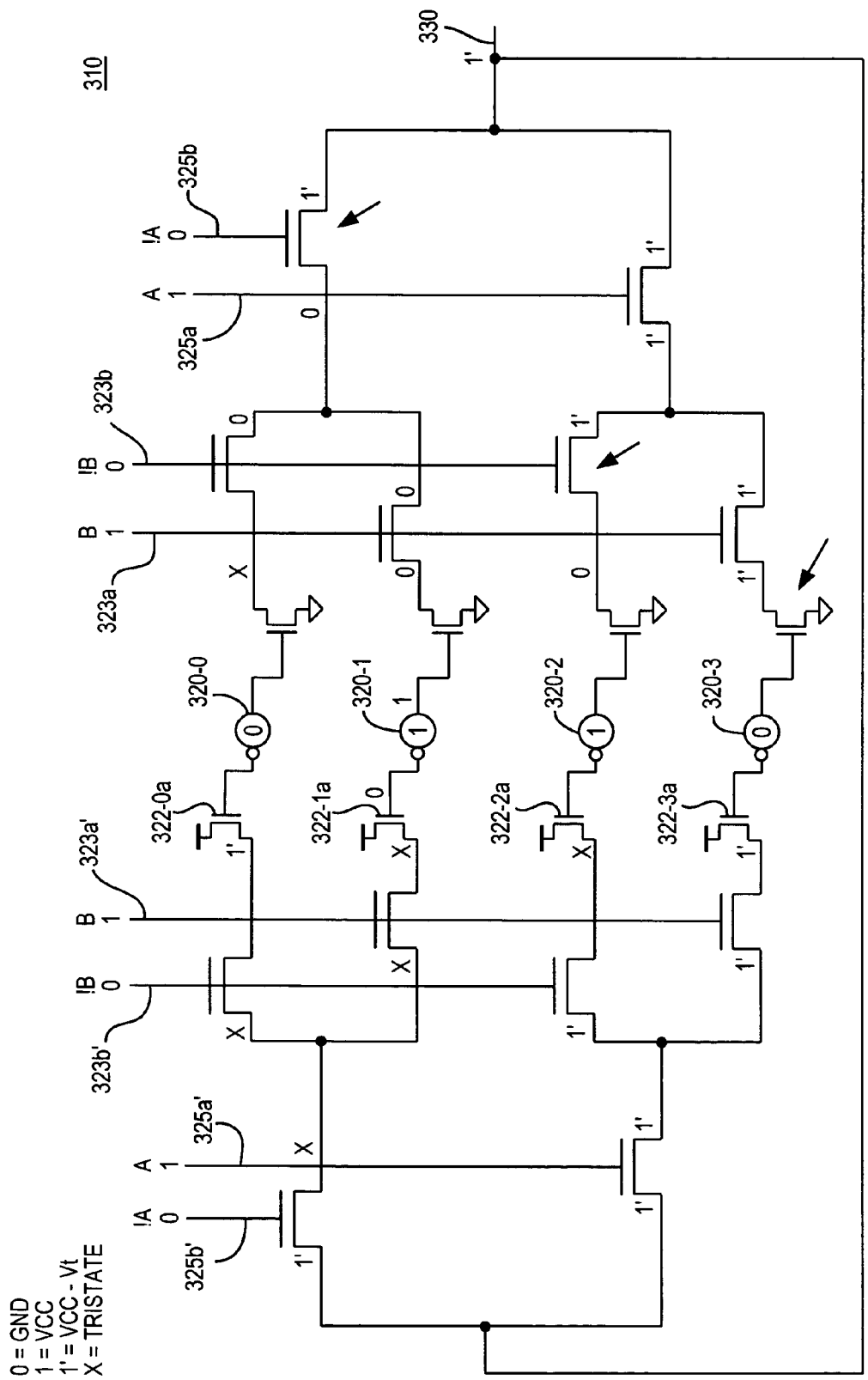
FIG. 5 is a simplified schematic diagram of still another illustrative embodiment of the invention.

FIG. 5 shows another alternative implementation 310 of the invention in which not only the PMOS tree is replaced by an NMOS tree (e.g., as in FIG. 4), but the PMOS transistor (e.g., 122-0a in FIG. 3) which is used to buffer the output of each RAM (e.g., 120-0 in FIG. 3) (i.e., the PMOS transistor whose gate is tied to the output of the RAM) is replaced with an NMOS transistor (e.g., 322-0a) whose gate is tied to the inverted output of the RAM (e.g., 320-0). If the RAM has an inverted output available, and if NMOS devices have significantly better drive characteristics than PMOS devices, this modification may result in a faster LUT. Again in FIG. 5, transistors that are off and not in series with another off transistor are indicated by arrows (for a particular, illustrative set of input signal values).

Both of the FIG. 4 and FIG. 5 modifications still result in LUTs with exponentially fewer leaking transistors than in the prior art.

Figure 6:
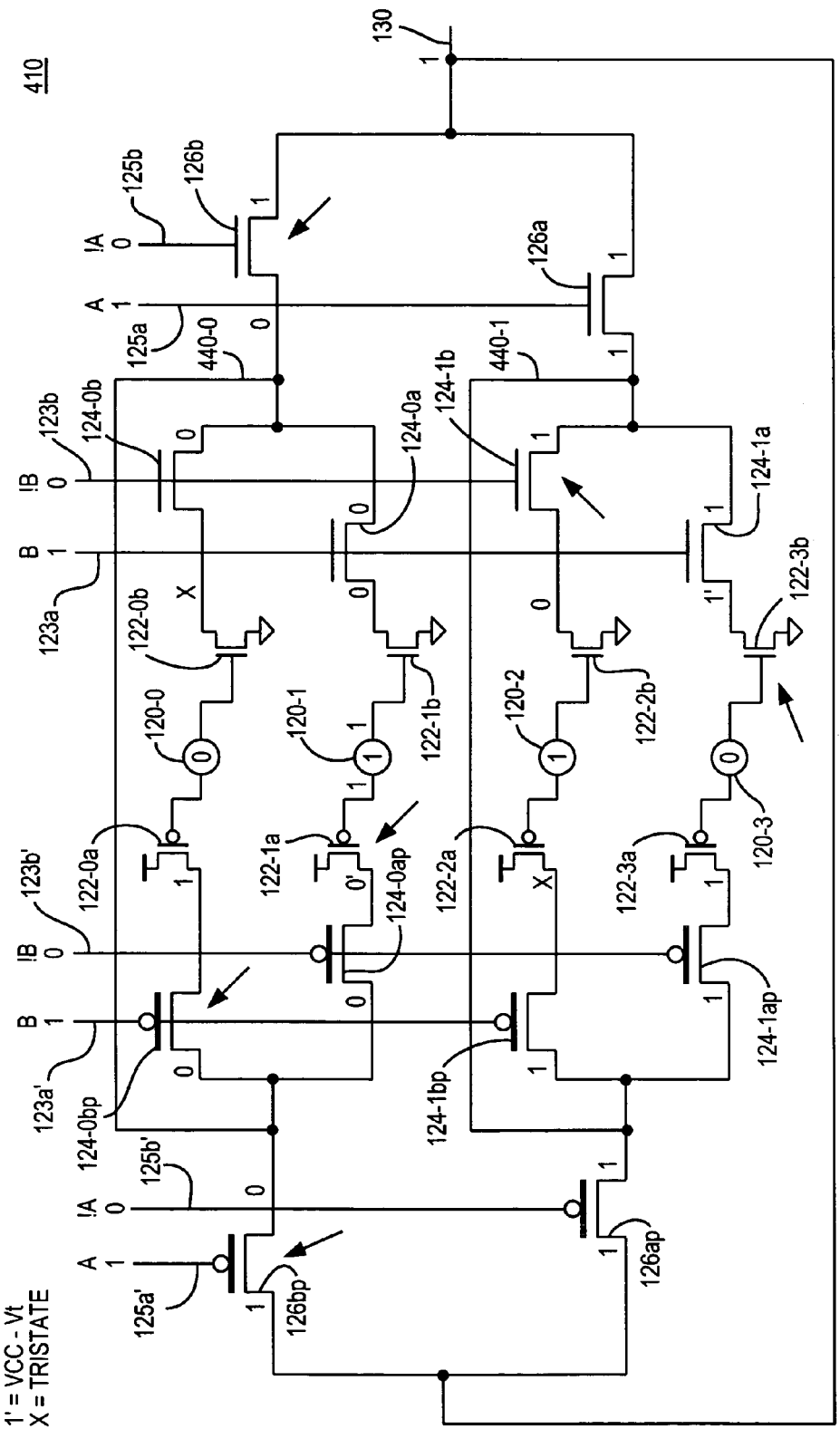
FIG. 6 is a simplified schematic diagram of yet another illustrative embodiment of the invention.

FIG. 6 shows another alternate implementation 410 of the invention in which some, but not all, of the internal nodes in the corresponding NMOS and PMOS trees are tied together. This may speed up those inputs that feed the subsequent (downstream) stage(s) of the mux tree.

The embodiment shown in FIG. 6 is similar to the embodiment shown in FIG. 3. Accordingly, the FIG. 3 reference numbers are used again for all FIG. 3 elements that are repeated in FIG. 6. The additional elements in FIG. 6 are conductors 440-0 and 440-1. Conductor 440-0 connects the outputs of NMOS transistors 124-0a and 124-0b to the outputs of PMOS transistors 124-0ap and 124-0bp. Conductor 440-1 similarly connects the outputs of NMOS transistors 124-1*a* and 124-1*b* to the outputs of PMOS transistors 124-1*ap* and 124-1*bp*. The presence of conductors 440 tends to speed up the mux selection circuitry downstream from those conductors. For example, comparing the signal levels associated with transistor 126*a* in FIGS. 3 and 6, it will be seen that in FIG. 3 to the left of transistor 126*a* is only 1' (i.e., somewhat less than VCC). But in FIG. 6 the signal at that location is 1 (i.e., full or substantially full VCC). This is an example of signal conditions that tend to make LUT 410 (FIG. 6) somewhat faster than LUT 110 (FIG. 3).

Once again in FIG. 6 transistors that are off and not in series with another off transistor are indicated by arrows (for a particular, illustrative set of signal values). There are more such arrows in FIG. 6 than in FIG. 3, but fewer than in FIG. 2, indicating that leakage current should still be less in circuitry of the type shown in FIG. 6 than in prior art circuitry as in FIG. 2.

Figure 7:
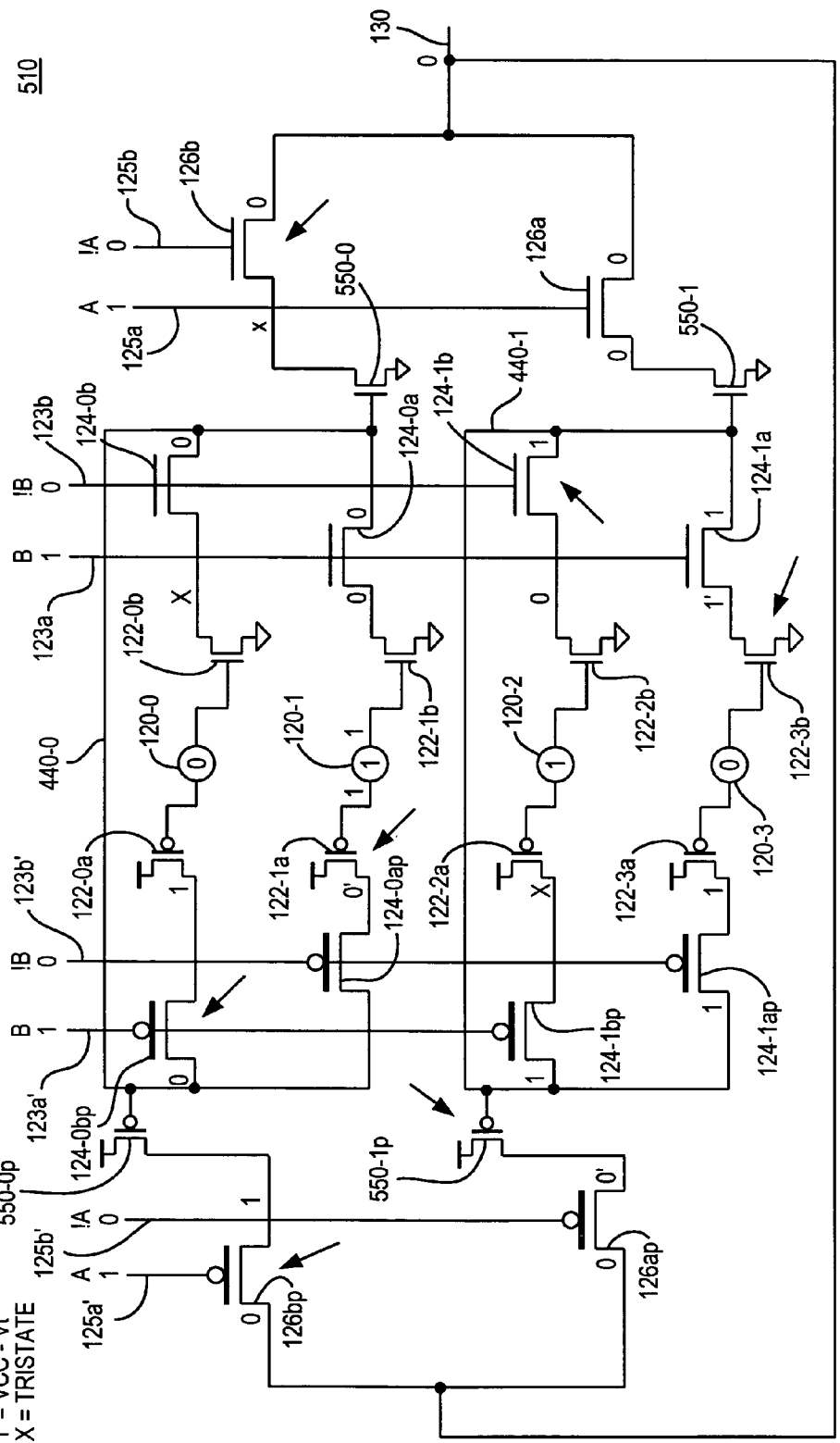
FIG. 7 is a simplified schematic diagram of still another illustrative embodiment of the invention.

FIG. 7 shows yet another alternate implementation 510 of the invention in which some stages of the N-input mux are rebuffered. In this implementation the internal nodes of the N-level mux are rebuffered after the first M stages, where after M stages there are $2^{N-M}$ partial "$2^M$-to-1" muxes which feed the M+1'th stage of the mux as if they were the outputs of $2^{N-M}$ RAMs feeding the first stage of a $2^{N-M}$-to-1 mux (as is elsewhere shown and described in this specification). If the LUT has many inputs, this may result in a faster LUT. It should be understood that any of the separate stages may itself be implemented in any of the other variations described in this specification.

In the example shown in FIG. 7 the circuitry is basically similar to what is shown in FIG. 6. Accordingly, the reference numbers used in FIG. 6 are used again for similar elements in FIG. 7. The elements added in FIG. 7 are rebuffering transistors 550 between the first stage of mux selection (controlled by input signal B) and the second stage of mux selection (controlled by input signal A). For example, NMOS rebuffering transistor 550-0 is connected between the outputs of first stage NMOS transistors 124-0*a* and 124-0*b* and the input of second stage NMOS transistor 126*b*. As another example, PMOS rebuffering transistor 550-1*p* is connected between the outputs of first stage PMOS transistors 124-1*ap* and 124-1*bp* and the input of second stage PMOS transistor 126-*ap*.

Again in FIG. 7 the transistors that are off and not in series with another off transistor are indicated by arrows (for the illustrative input signal values). Also, again, there are more such arrows in FIG. 7 than in FIG. 3, but fewer than in FIG. 2, indicating that leakage current should still be less in circuitry of the type shown in FIG. 7 than in prior art circuitry like that shown in FIG. 2.

FIG. 8 is a table which summarizes certain signal conditions in each of the illustrative embodiments of the invention that are shown in FIGS. 3–7 and described above. In particular, FIG. 8 shows how each possible logical state of a selectable signal (120/320) is manifested at the output of each of the two buffer transistors (122/322) controlled by that selectable signal. For example, the first line of FIG. 8 is for the illustrative embodiment 110 shown in FIG. 1. The left-hand two columns are for the first logical state (e.g., 0) of a selectable signal (120) in that embodiment, and the right-hand two columns are for the second logical state (e.g., 1) of that same selectable signal. Continuing with the example of the first line in FIG. 8, FIG. 3 shows that if a selectable signal (e.g., 120-0) is 0, the output of the associated buffer transistor (e.g., 122-0*a*) feeding the selection tree on the left is logic 1, and the output of the associated buffer transistor (e.g., 122-0*b*) feeding the selection tree on the right is "no drive" (i.e., exemplary transistor 122-0*b* is off, so that its output node is not driven to any particular logic level by that transistor). Accordingly, the two left-hand entries in the first line in FIG. 8 are 1 and no drive. FIG. 3 further shows that if a selectable signal has the other logical state (i.e., 1) then the output of the associated buffer transistor on the left is no drive, and the output of the associated buffer transistor on the right is logic 0. (Selectable signal 120-1 and its associated buffer transistors 122-1*a* and 122-1*b* in FIG. 3 illustrate this set of signal conditions.) Accordingly, the two right-hand entries in the first line of FIG. 8 are no drive and 0.

FIG. 8 uses as column headings the terms "first manifestation" and "second manifestation." These first and second signal manifestations are respectively the inputs to the first and second selection circuits that are employed in accordance with the invention. For example, in FIG. 3 the first selection circuit may be the selection circuitry (124*p*/126*p*) on the left, and the second selection circuit may be the selection circuitry (124/126) on the right. Thus FIG. 8 shows that in each embodiment of the invention, each selectable signal is provided in two, electrically different, signal manifestations; and each of these manifestations is different, depending on the logical state of the selectable signal. If a selectable signal is logic 0, its first manifestation may be logic 1 (electrically full VCC or (in the case of FIG. 5) VCC-Vt) and its second manifestation may be no drive. If the same selectable signal is logic 1, its first manifestation may be no drive and its second manifestation may be logic 0. Stated another way, the first manifestation of a selectable signal is selected from the group consisting of logic 1 and no drive (depending on the logical state of the selectable signal), the second manifestation of that signal is selected from the group consisting of no drive and logic 0 (again depending on the logical state of the selectable signal), and the first and second manifestations are always electrically different from one another (i.e., only one manifestation is no drive for either state of any selectable signal).

It will be understood that a selectable signal may cause a no drive manifestation of that signal to be applied to an input node of selection circuitry, but that node may be driven to a particular state by other downstream circuitry. In FIG. 3, for example, the output node of NMOS buffer transistor 122-3*b* receives a no drive signal manifestation of selectable signal 120-3 from that transistor. That no drive signal manifestation has no particular effect on the electrical potential of the node receiving it, but that node is driven to 1' by other downstream circuitry. This does not alter the fact that the output manifestation of selectable signal 120-3 at this node is no drive. The signal "manifestations" referred to herein are at the upstream ends of selection trees, not after any selection within a selection tree or any upstream flow through any selection tree circuitry.

The particular relationships between (1) the logical state of a selectable signal and (2) the first and second manifestations of that signal shown in FIG. 8 and described above are only examples, and these particular relationships can be altered if desired without departing from the invention. For example, it is said above that when a selectable signal is logic 0, its two output manifestations can be logic 1 and no drive; and that when the selectable signal is logic 1, its two output manifestations can be no drive and logic 0. These relationships can be changed so that, for example, when a selectable signal is logic 1, its two output manifestations are logic 1 and no drive; and when the selectable signal is logic 0, its two output manifestations are no drive and logic 0. Other variations are, of course, also possible.

It will be understood that the foregoing is only illustrative of the principles of the invention, and that various modifications can be made by those skilled in the art without departing from the scope and spirit of the invention. For example, the two-input LUTs shown in all the FIGS. herein are only an example. The invention is equally applicable to larger and smaller LUTs, as desired. Also, application of the invention to LUTs is only an example of possible uses of the invention, because the invention is equally applicable to any tree decoder (of which LUTs are an example). It will also be understood that the particular signal levels or conditions (e.g., 1, 1', 0, or X) shown throughout the drawings herein are only examples. Different data in the RAM cells and/or different selection input signal values can result in different signal values or conditions at various points throughout the circuitry. This can mean different transistors being on and off, with the consequence that different transistors would be pointed out by the arrows in the FIGS. But the examples shown in the FIGS. are generally representative of the kinds of conditions that occur in the depicted circuitry in all of the various possible operating situations.

What is claimed is:

1. Look-up table circuitry comprising:
    a plurality of selectable signal sources, each of which produces electrically different first and second signal manifestations of that source's selectable signal;
    a source of a selection control signal;
    first selection circuitry responsive to the selection control signal for operating on the first signal manifestations to select a subset of the selectable signals;
    second selection circuitry responsive to the selection control signal for operating on the second signal manifestations to select the subset of the selectable signals; and
    an output connection between corresponding signals in the subset as selected by each of the first and second selection circuitries.

2. The circuitry defined in claim 1 wherein each of the selectable signal sources comprises:
    memory cell circuitry having separate true and complement outputs.

3. The circuitry defined in claim 1 wherein each of the selectable signal sources comprises:
    memory cell circuitry having an output;
    NMOS output buffer circuitry for producing a first signal manifestation of the memory cell output; and
    PMOS output buffer circuitry for producing a second signal manifestation of the memory cell output.

4. The circuitry defined in claim 1 wherein the first selection circuitry comprises:
    a tree of NMOS transistors controlled by the selection control signal.

5. The circuitry defined in claim 4 wherein different transistors in the tree are respectively controlled by true and complement versions of the selection control signal.

6. The circuitry defined in claim 1 wherein the second selection control circuitry comprises:
    a tree of PMOS transistors controlled by the selection control signal.

7. The circuitry defined in claim 6 wherein different transistors in the tree are respectively controlled by true and complement versions of the selection control signal.

8. The circuitry defined in claim 5 wherein the second selection circuitry comprises:
    a second tree of PMOS transistors controlled by the selection control circuitry.

9. The circuitry defined in claim 8 wherein different transistors in the second tree are respectively controlled by true and complement versions of the selection control signal.

10. The circuitry defined in claim 5 wherein the second selection circuitry comprises:
    a second tree of NMOS transistors controlled by the selection control circuitry.

11. The circuitry defined in claim 10 wherein different transistors in the second tree are respectively controlled by true and complement versions of the selection control signal employed inversely as compared to in the first-mentioned tree.

12. The circuitry defined in claim 2 further comprising:
    NMOS output buffer circuitry operating on the true output; and
    PMOS output buffer circuitry operating on the complement output.

13. The circuitry defined in claim 12 wherein the first selection circuitry comprises:
    a first tree of NMOS transistors operating on outputs of the NMOS output buffer circuitry; and wherein the second selection circuitry comprises:
    a second tree of NMOS transistors operating on outputs of the PMOS output buffer circuitry.

14. The circuitry defined in claim 1 wherein the source of a selection control signal is one of a plurality of selection control signal sources, each of which provides a respective one of a plurality of selection control signals.

15. The circuitry defined in claim 14 wherein each of the first and second selection control circuitries is responsive to the plurality of selection control signals.

16. The circuitry defined in claim 15 wherein in each of the first and second selection control circuitries the subset results from a first selection controlled by a first of the selection control signals and a second selection that starts from results of the first selection and that is controlled by a second of the selection control signals.

17. The circuitry defined in claim 16 wherein at least one of the first and second selection circuitries comprises:
    rebuffering circuitry for rebuffering signals between the first selection and the second selection.

18. The circuitry defined in claim 1 wherein the first signal manifestation of each selectable signal source is selected from the group consisting of logic 1 and no drive, depending on the logical state of the selectable signal source; wherein the second signal manifestation of each selectable signal source is selected from the group consisting of no drive and logic 0, depending on the logical state of the selectable signal source; and wherein the first and second signal manifestations of each selectable signal source are further selected to prevent both from being no drive at the same time.

19. A method of selecting a desired signal from a plurality of selectable signals comprising:
    providing each of the selectable signals in electrically different first and second signal manifestations;
    using a selection control signal to select the desired signal by operating on the first signal manifestations of the selectable signals;
    using the selection control signal to select the desired signal by operating on the second signal manifestations of the selectable signals; and
    combining selections of the desired signal resulting from the two preceding steps.

20. Circuitry for selecting a desired signal from a plurality of selectable signals comprising:
- circuitry for providing each of the selectable signals in electrically different first and second signal manifestations;
- first selection circuitry responsive to a selection control signal for operating on the first signal manifestations of the selectable signals to select the desired signal;
- second selection circuitry responsive to the selection control signal for operating on the second signal manifestations of the selectable signals to select the desired signal; and
- circuitry for combining the desired signal as selected by both of the first and second selection circuitries.

21. The circuitry defined in claim 20 wherein at least one of the first and second selection circuitries is responsive to true and complement versions of the selection control signal.

22. The circuitry defined in claim 20 wherein at least one of the first and second selection control circuitries comprises:
- a tree of NMOS transistors.

23. The circuitry defined in claim 20 wherein at least one of the first and second selection control circuitries comprises:
- a tree of PMOS transistors.

24. The circuitry defined in claim 20 wherein the first and second selection circuitries respectively comprise:
- first and second trees of NMOS transistors.

25. The circuitry defined in claim 20 wherein the first and second selection circuitries respectively comprises:
- a first tree of NMOS transistors; and
- a second tree of PMOS transistors.

* * * * *